(12) United States Patent
Pinneo et al.

(10) Patent No.: US 6,749,931 B1
(45) Date of Patent: Jun. 15, 2004

(54) DIAMOND FOAM MATERIAL AND METHOD FOR FORMING SAME

(75) Inventors: John M. Pinneo, Portola Valley, CA (US); Howard Davidson, Palo Alto, CA (US)

(73) Assignees: P1 Diamond, Inc., Santa Clara, CA (US); Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/708,100

(22) Filed: Nov. 1, 2000

(51) Int. Cl.[7] ................................................. B32B 3/26
(52) U.S. Cl. ............................... 428/319.1; 428/307.3; 428/315.5; 428/315.7; 428/315.9; 428/312.2; 428/312.8; 428/313.9
(58) Field of Search ................ 428/307.3, 315.5, 428/315.7, 315.9, 312.2, 312.8, 313.9, 39.1

(56) References Cited

U.S. PATENT DOCUMENTS

| | | | | |
|---|---|---|---|---|
| 3,918,220 A | * | 11/1975 | Jury et al. ..................... 451/59 |
| 4,288,248 A | * | 9/1981 | Bovenkerk et al. ............. 419/2 |
| 4,559,244 A | * | 12/1985 | Kasprzyk et al. ............ 427/227 |
| 4,944,772 A | * | 7/1990 | Cho ............................. 51/293 |
| 4,960,643 A | * | 10/1990 | Lemelson .................... 428/408 |
| 5,316,842 A | * | 5/1994 | Herb et al. ............... 428/319.1 |
| 5,322,116 A | * | 6/1994 | Galloway et al. ............ 165/133 |
| 6,196,307 B1 | * | 3/2001 | Ozmat ......................... 165/185 |
| 6,361,857 B1 | * | 3/2002 | Saito et al. ............... 428/319.1 |

* cited by examiner

Primary Examiner—Terrel Morris
Assistant Examiner—Hai Vo
(74) Attorney, Agent, or Firm—Sierra Patent Group, Ltd.

(57) ABSTRACT

A diamond foam article comprises diamond deposited material on a substrate having an open contiguous structure that permits the flow of fluids in at least one direction through the material. Methods for forming a diamond foam article comprise providing a foam substrate; preparing the foam substrate for diamond deposition; and depositing diamond material on the foam substrate by one of several diamond deposition methods.

2 Claims, 6 Drawing Sheets

DIAMOND FOAM MATERIAL AND METHOD FOR FORMING SAME

BACKGROUND OF THE INVENTION

1. Field of the Invention

The present invention relates to a new type of material that employs diamond to enhance its physical properties. More specifically, the present invention relates to a diamond material coated into and throughout an open-cell reticulated structure that permits fluid flow through its void volume.

2. The Prior Art

There is a broad class of known materials classed as open-cell foams. These materials consist of reticulated structures through which fluids can flow. They resemble the intersections observed in a mass of bubbles, hence their description as "foam".

These materials can be fabricated by a variety of means, and are available in various ceramics, metals, and carbon. These materials exhibit a three-dimensional reticulated unitary structure, which distinguishes them from other open-cell structures, such as stacked screens, comprising the mechanical juxtaposition of otherwise separate components.

These materials find a variety of uses in industry. For example, foams made of silicon carbide can be used to filter slag from molten aluminum. In other applications, fluid flows through a foam structure to carry away or supply heat. In this use, the inherent high surface area to volume ratio of the foam provides superior heat transport compared to planar heat exchangers.

Diamond/nondiamond composite materials formed by chemical vapor infiltration are also known in the art. Examples of such materials are found in U.S. Pat. Nos. 5,609,955 and 5,614,140. These materials are formed by consolidation of particulate substrate materials with diamond deposited through chemical vapor infiltration processes. These materials often contain residual porosity, or voids, that remain due to the blockage of diffusion channels that supply activated gas species to the interior. These voids degrade the material's bulk thermal conductivity and can act as stress concentrators to reduce breakage resistance. These residual porosities or voids are often closed off from the external environment and therefore cannot play any role in supporting fluid flow through the consolidated composite material.

These materials are distinct from the present invention in two important respects. First, they are formed by fusion of a multiplicity of separate particles into a single resultant structure, whereas the instant invention coats an existing unitary structure with diamond. Second, diamond composites formed using the teachings found in prior art exhibit little or no permeability to fluid flow through a their volume, whereas a specific object of the instant invention is maintenance of permeability to permit fluid flow through the structure.

BRIEF DESCRIPTION OF THE INVENTION

The present invention is diamond foam, and means for its manufacture, consisting of diamond deposited on a pre-existing framework, said framework being compatible with diamond deposition, and having an open-cell structure adequate to permit fluid flow in at least one direction (axis) through the material subsequent to diamond deposition, said framework having structural integrity prior to the deposition of diamond. In particular, the framework does not consist of loose particles or fibers consolidated by diamond deposition.

A diamond foam according to the present invention comprises diamond deposited material on a substrate having an open contiguous structure that permits the flow of fluids in at least one direction through the material.

A method for forming a diamond foam according to the present invention comprises providing a foam substrate; preparing the foam substrate for diamond deposition; and depositing diamond material on the foam substrate. According to the present invention, the diamond material can be deposited on the foam substrate by one of several diamond deposition methods.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1A:
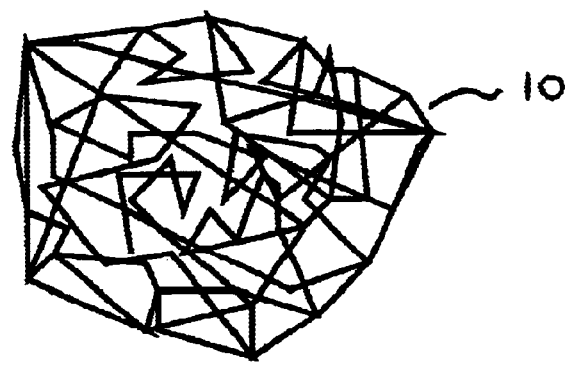
FIGS. 1A and 1B are, respectively, schematic perspective views of an uncoated substrate framework material and a diamond foam article according to the present invention.
Figure 1B:
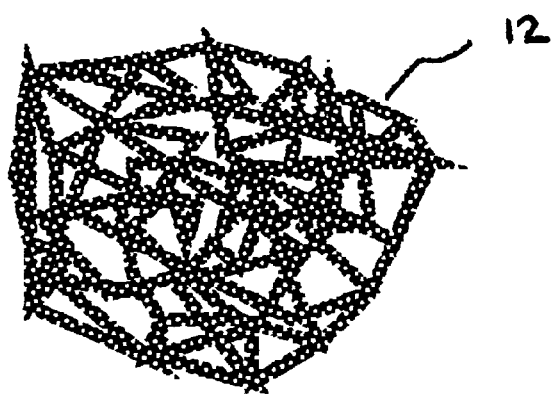

Referring first to FIGS. 1A and 1B, simplified diagrams illustrate a framework 10 upon which a diamond layer is formed according to the present invention to produce a diamond foam article 12. An uncoated framework material 10 shown in FIG. 1A forms a substrate for the diamond foam articles of the present invention. Materials composing the substrate framework on which diamond is to be grown comprise those materials known to be suitable hosts for diamond deposition, including without limitation, molybdenum, tungsten, silicon nitride, silicon carbide, boron carbide, and boron nitride and mixtures thereof. Substrate network materials may also consist of materials that are not suitable for diamond deposition, so long as they are coated with an interlayer that is compatible with diamond deposition. An example is the use of steel foam network material overcoated prior to diamond deposition with a thin layer of titanium, which is known to the art to enable diamond deposition on steel, which, without an interlayer such as titanium, will not permit formation of adherent diamond coatings. A non-limiting example of a commercially-available substrate material is a silicon carbide foam substrate material such as DuoCell/SiC, nominal 25 pores/inch, available from ERG Materials and Aerospace Corporation of Oakland, Calif.

With regard to the operability of the diamond foam articles of the present invention over a range of foam porosities and void size distributions, it is operable at the small end of foam porosity until either the interstices within the coated framework become so small as to preclude formation of the necessary plasma layer on its surfaces, and/or the resistance to gas flow becomes so large as to preclude the transport of reactant gases to the desired deposition sites, precluding diamond deposition. In practice, these effects will occur at porosity sizes that will vary at least as functions of gas pressure, plasma excitation frequency and power, and foam substrate network temperature, as well as other parameters particular to each individual deposition apparatus. The present invention is operative to open-cell foams with average void size distributions at least as small as 100/inch. In the limit for large foam porosities, the invention is operative until porosities become so large as to render the material mechanically unstable, and therefore useless for applications, or until so much diamond would have to be deposited to impart useful properties as to be economically impractical. The present invention is operative for open-cell foam substrate materials with a void size distribution at least as large as one every 2 inches.

In most applications of the present invention, it will be desirable to apply sufficient diamond to the substrate network material to produce a fully coalesced coating, with no holes or other imperfections that might compromise the integrity of the underlying network substrate material or impair achieving the properties it is desired to achieve through application of the diamond coating. The present invention contemplates a minimum diamond coating thickness of approximately 2 micrometers to provide a fully coalesced coating. As is understood by those of ordinary skill in the art of diamond deposition, the minimum coating thickness required to achieve an absence of coating defects may vary substantially according to the particulars of the substrate network material, the preparation of said material for coating with diamond, and/or the diamond coating technology selected.

As will be appreciated by persons of ordinary skill in the art, the three-dimensional shape of finished diamond foam articles according to the present invention may be determined by providing a framework substrate 10 having a desired geometry.

Figure 2A:
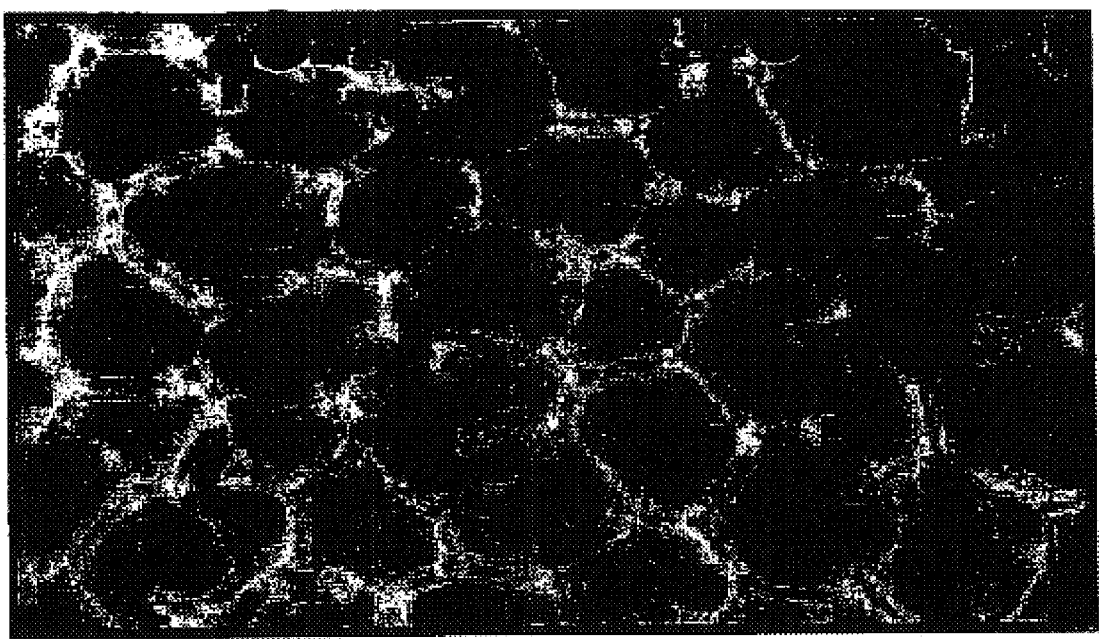
FIGS. 2A and 2B are microphotographs which respectively show a silicon carbide foam substrate framework material prior to, and after, diamond deposition to form a diamond foam article according to the present invention.
Figure 2B:
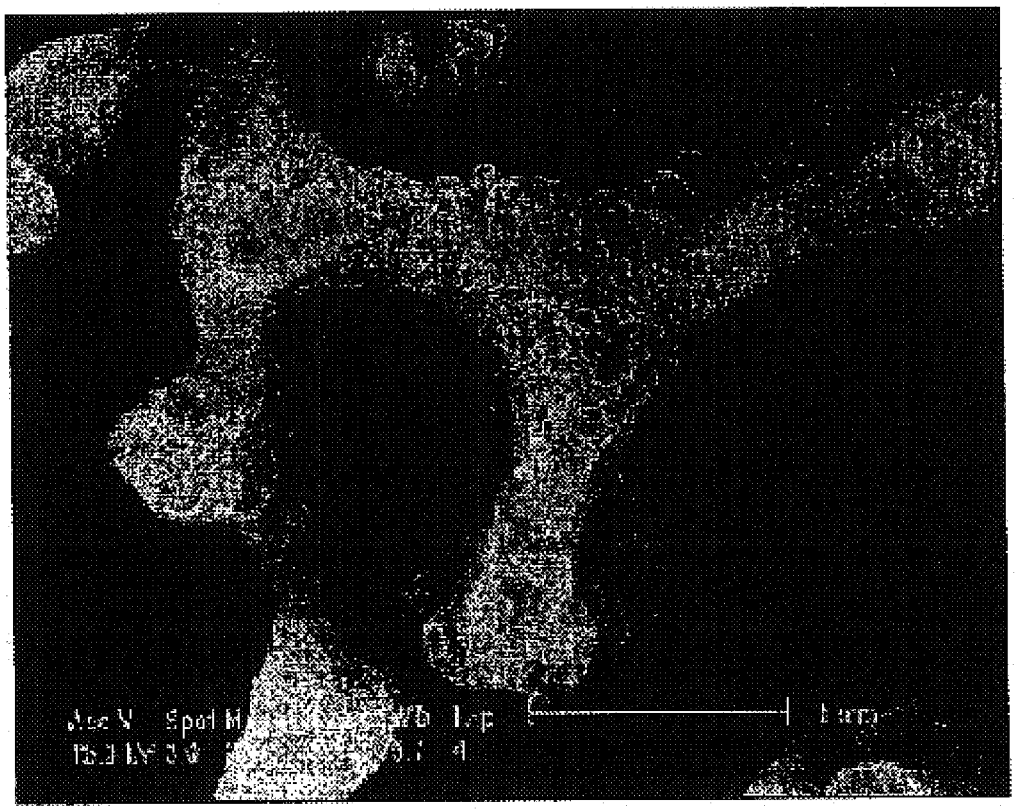

The framework 10 of FIG. 1A is coated with a layer of diamond material as taught herein to form diamond foam article 12 as illustrated in FIG. 1B. FIGS. 2A and 2B, respectively, are microphotographs which respectively show a silicon carbide foam substrate framework material prior to, and after, diamond deposition to form a diamond foam article according to the present invention. More specifically, FIG. 2A shows the structure of the substrate material 10 at a magnification of about 16× and FIG. 2B shows the structure of a completed diamond foam article 12 at a magnification of about 100×

According to the methods for forming diamond foam articles of the present invention, a suitable substrate framework material is exposed to diamond deposition through chemical vapor deposition (CVD) means known to the art. Suitable diamond CVD methods include, but are not limited to, plasma-assisted CVD (including microwave, RF, and plasma torch variants), hot filament CVD, and combustion torch CVD. Diamond deposits on the surfaces of the exposed substrate framework at a rate that is determined by the particular deposition modality and process conditions employed. When the desired thickness of diamond has been achieved, the process is halted and the diamond foam material is removed from the deposition system.

The following examples are illustrative of processes which may be employed according to the present invention to form the diamond foam article according to the present invention.

Embodiment 1

Figure 3:
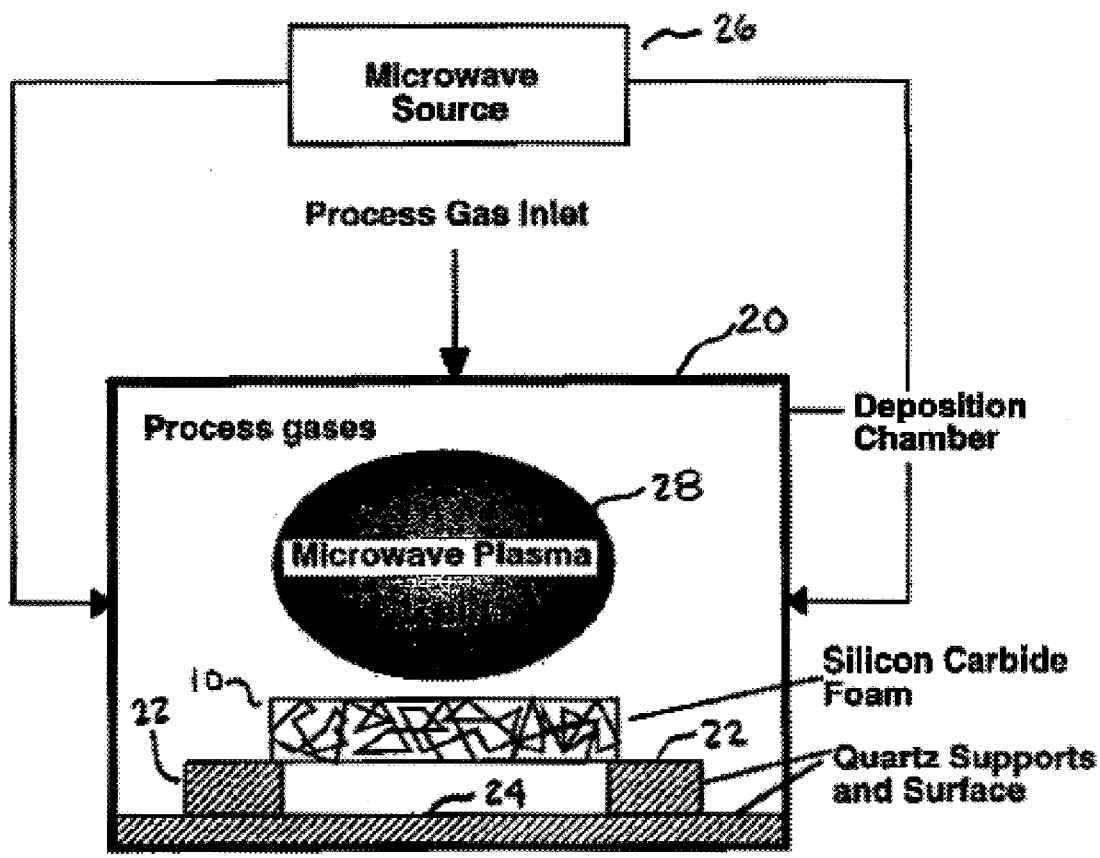
FIG. 3 is a diagram illustrating a first illustrative process for forming a diamond foam material according to the present invention.

A first illustrative process for forming a diamond foam article according to the present invention is illustrated in FIG. 3. A silicon carbide foam substrate material 10 (DuoCell/SiC, nominal 25 pores/inch, from ERG Materials and Aerospace Corporation of Oakland, Calif.) having dimensions 1 inch×1 inch×0.25" thick, is washed for 10 minutes with mild agitation in a solution of isopropyl alcohol containing 10 grams/liter of 0.1 micron diamond dust to induce rapid diamond nucleation and growth in a manner known to the art. The silicon carbide foam is removed from the diamond dust/alcohol slurry and allowed to dry.

As shown in FIG. 3, the dried silicon carbide foam is then placed in a reactor 20 suitable for diamond deposition using microwave-assisted plasma technology well-known to the art. The foam is supported on quartz supports 22 with one of its broad faces parallel to, and 1 centimeter above, a quartz surface 24, as shown in FIG. 2. The chamber is closed and evacuated. A process gas consisting of a mixture of 98 parts hydrogen and 2 parts methane by volume is admitted to the chamber. Microwave power is applied to the chamber 20 from microwave source 26 such that a region of ionization, or plasma 28, is formed. The position of the foam substrate material 10 is adjusted with respect to the plasma excitation zone such that the plasma 28 impinges on its upper surface. In the instant reactor, microwave energy is supplied at 915 MHz and at a power level ranging from 2 kW to 5 kW. Gas pressure is controllable between 1 and 200 Torr, and gas flow rates are variable between 1 and 1000 sccm for all gases. Microwave power and process gas pressure are adjusted such that the upper surface temperature of the foam, as measured by noninvasive infrared optical means known to the art, lies between 650 degrees Centigrade and 900 degrees Centigrade, to permit the deposition of high quality diamond. Deposition is continued for a period of 24 hours, after which the diamond-coated foam is removed from the chamber. The silicon carbide foam substrate network is found to be coated throughout its volume with diamond ranging in thickness from approximately 100 microns on the upper surface to approximately 50 microns on the lower surface.

Embodiment 2

Figure 4:
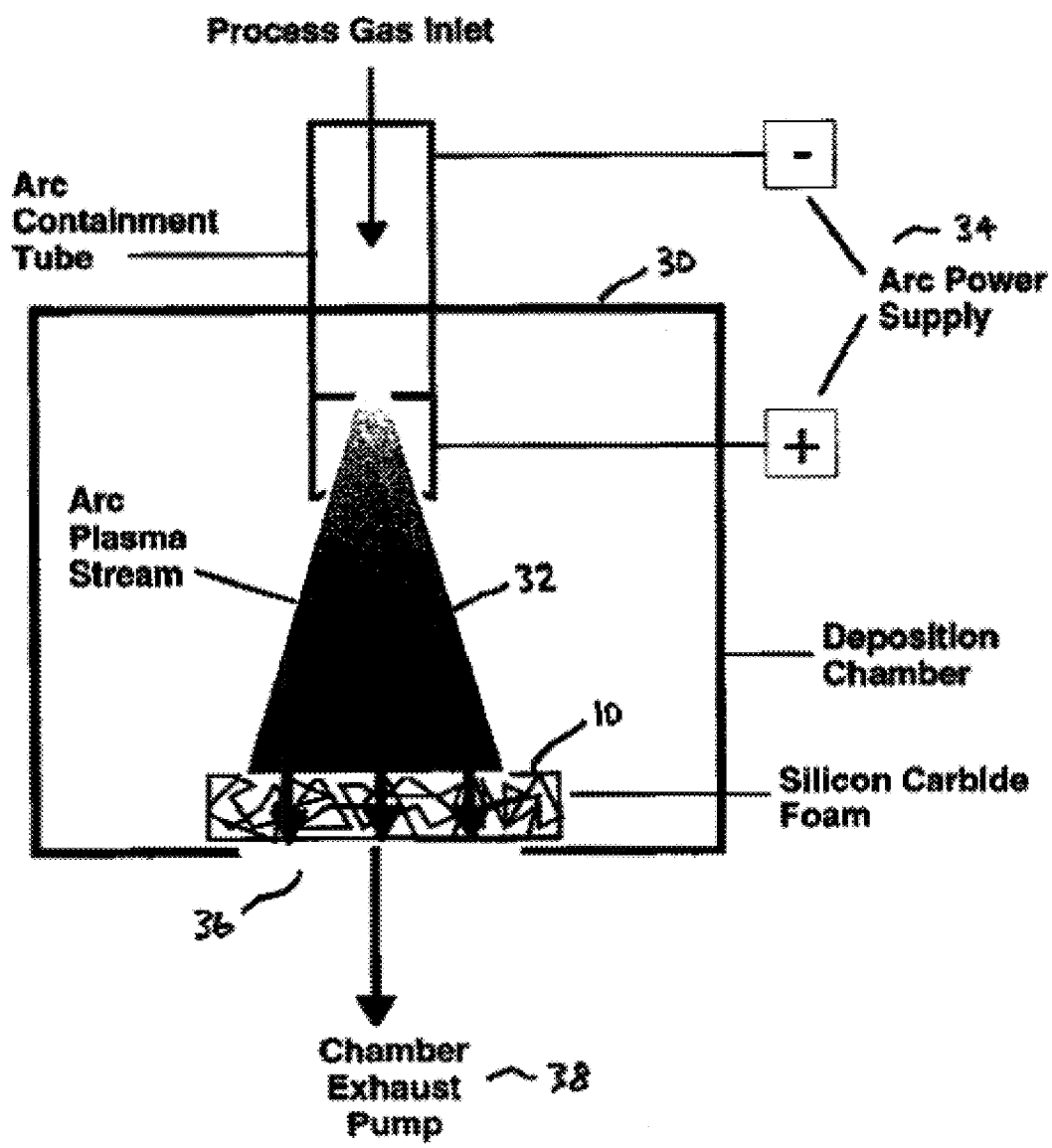
FIG. 4 is a diagram illustrating a second illustrative process for forming a diamond foam material according to the present invention.

A second illustrative process for forming a diamond foam article according to the present invention is illustrated in FIG. 4. A silicon carbide foam substrate material 10 (DuoCellSiC, nominal 25 pores/mch, from ERG Materials and Aerospace Corporation of Oakland, Calif.) having dimensions 1 inch×1 inch ×0.25" thick, is washed for 10 minutes with mild agitation in a solution of isopropyl alcohol containing 10 grams/liter of 0.1 micron diamond dust to induce rapid diamond nucleation and growth in a manner known to the art The silicon carbide foam material 10 is removed from the diamond dust/alcohol slurry and allowed to dry.

The dried silicon carbide foam material 10 is then placed in a reactor 30 suitable for diamond deposition using electrical torch plasma-assisted technology well-known to the art. The deposition chamber 30 is evacuated, and process gases in a mixture of 97 parts hydrogen to 3 parts methane by volume are admitted to the chamber 30. The silicon carbide foam material 10 is supported so as to allow a plasma torch gas stream 32 ignited by arc power supply 34 to impinge on the first broad face of the foam material 10, while its opposing broad face is disposed immediately adjacent to the exhaust port 36 through which process gases flow from the chamber 30 to the exhaust pump 38, effectively causing the energized plasma gases to flow through the porous silicon carbide foam material 10, as shown in FIG. 4.

Torch electrical power, gas flow rate, and chamber pressure are adjusted to maintain the first (impingement) surface of the silicon carbide foam between 650 degrees Centigrade and 900 degrees Centigrade, to permit the deposition of high quality diamond. Deposition is continued for a period of 5 hours, after which the diamond-coated foam is removed from the chamber 30. The silicon carbide foam substrate network is found to be coated throughout its volume with diamond ranging in thickness from approximately 150 microns on its upper surface upon which the plasma impinged, to approximately 100 microns on its lower surface through which gases exited the deposition chamber.

Embodiment 3

Figure 5:
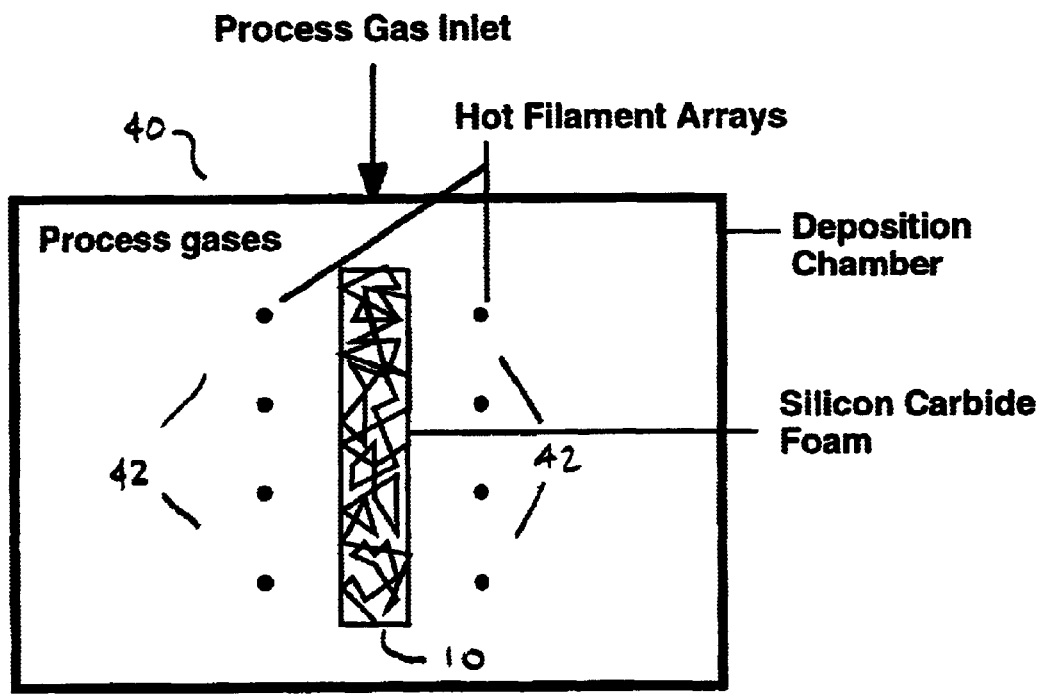
FIG. 5 is a diagram illustrating a third illustrative process for forming a diamond foam material according to the present invention.

A third illustrative process for forming a diamond foam article according to the present invention is illustrated in FIG. 5. A silicon carbide foam material 10 is prepared as in the foregoing embodiments. The silicon carbide foam material 10 is placed in a chamber 40 suitable for diamond deposition using the hot filament technology well-known to the art. The silicon carbide foam material 10 is mounted between two arrays 42 of tantalum filaments such that each broad face lies approximately 1 centimeter from its opposed filament array 42 and parallel thereto, as shown in FIG. 4. The deposition chamber 40 is exhausted, and a deposition gas mixture consisting of 985 parts hydrogen and 1.5 parts methane by volume is admitted to the chamber 40. Electrical power is applied to the filament arrays 42, heating them to a temperature of 2,100 degrees Centigrade. Pressure in chamber 40 is adjusted to 30 Torr. The silicon carbide foam material 10 is found to exhibit a temperature of approximately 825 degrees Centigrade. Diamond deposition is continued for a period of 24 hours. The silicon carbide foam substrate network 10 is found to be coated throughout its volume with diamond ranging in thickness from approximately 40 microns on one surface opposed to one filament array, to approximately 40 microns on the other surface opposed to the other filament array.

Embodiment 4

Figure 6:
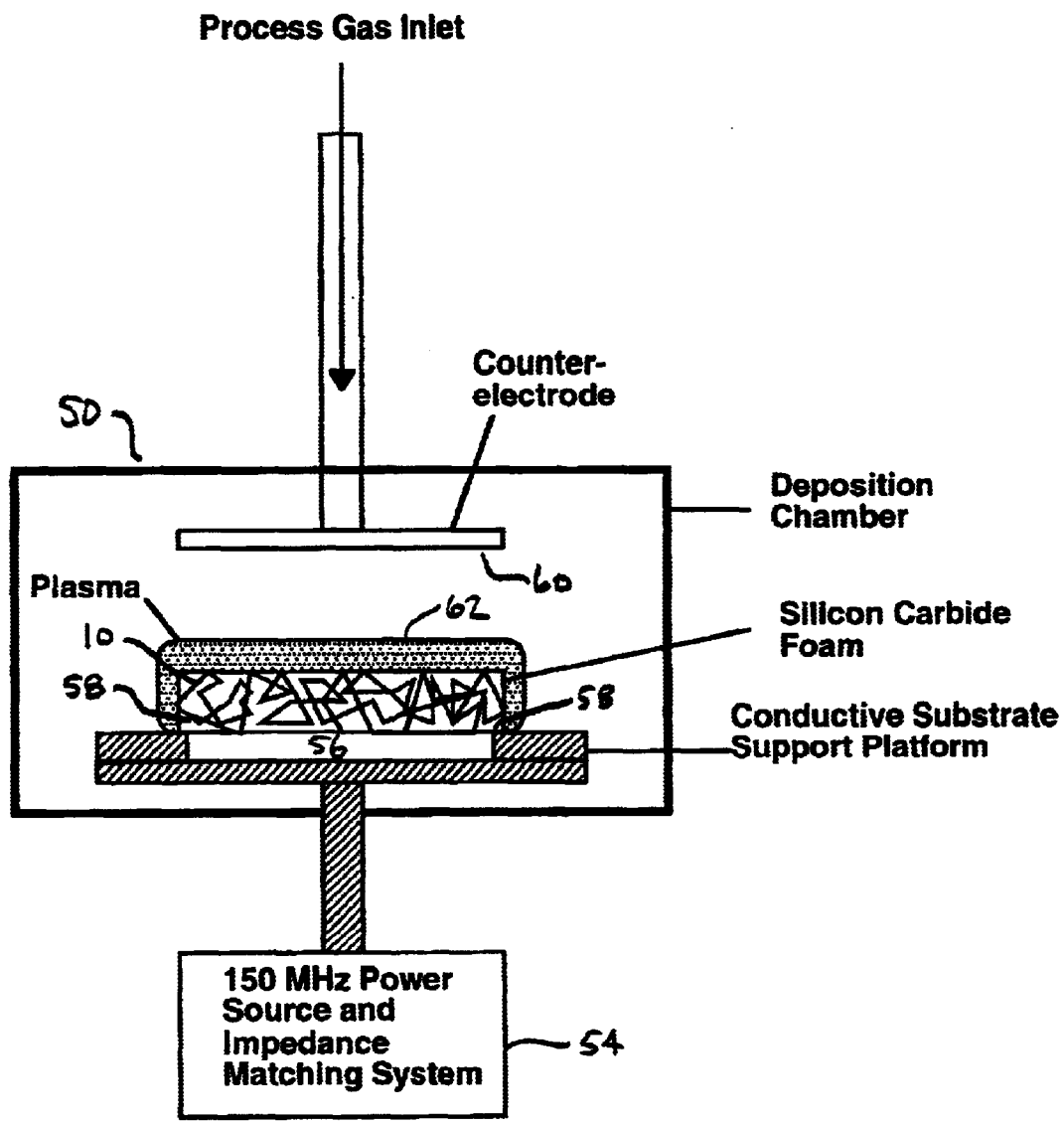
FIG. 6 is a diagram illustrating a fourth illustrative process for forming a diamond foam material according to the present invention.

A fourth illustrative process for forming a diamond foam article according to the present invention is illustrated in FIG. 6. A silicon carbide foam material 10 is prepared as in the foregoing embodiments. The foam material 10 is placed in a chamber 50 suitable for diamond deposition using radio-frequency energy known to those skilled in the art. Means are provided whereby the silicon carbide foam material is supported on an electrically conductive platform 52 that serves to couple radio-frequency energy from RF source 54 to the foam material 10, leaving a 1 centimeter space 56 between the foam surface adjacent to the substrate support platform 52 save for a small area 58 near the periphery of the foam that touches the substrate support platform 52 to provide electrical contact therewith. A counterelectrode 60 is provided adjacent to this platform to assist in igniting and maintaining a plasma 62, as shown in FIG. 5. RF source 54 introduces radio frequency energy into the deposition chamber, with due regard for the need to achieve gas isolation and good electrical impedance matching as is known in the art.

The chamber 50 is sealed and exhausted. Deposition gases, consisting of 97 parts hydrogen and 3 parts by volume of methane are admitted to the chamber 50. Radio frequency energy at 150 MHz is applied to the electrically conductive foam support 52, and a plasma 62 is observed to light in a configuration that conforms closely to the surface of the foam material 10 and its subjacent support platform 52. Radio frequency power and gas pressure are increased until the temperature of the foam material 10 is within the range of 650 degrees Centigrade to 900 degrees Centigrade.

Deposition is continued for 5 hours, and is then terminated. On removal from the chamber 50, the silicon carbide foam material 10 is found to have been coated with approximately 75 microns of diamond on the surface facing the counterelectrode 60 and with approximately 50 microns of diamond on the surface facing the substrate support platform 52.

It will be apparent to those skilled in the art that the above process conditions are recited by way of illustration, not limitation, the particulars of process conditions for deposition of diamond being determined by variations among specific diamond deposition systems. The recitation of silicon carbide foam in a planar, prismatic configuration as a substrate material is not by way of exclusion of nonplanar open cell substrates, such as spheres, cones, cups, tubes, cylinders, or other geometries or substrate materials from the practice of this invention. Recitation of reticulated foam structures having substantially random distribution of voids as substrates for preparation of diamond foam materials is not by way of exclusion of structures having voids that are disposed in more regular or repeating fashion.

The utility of the articles of the present invention lies in the combination of high surface area with the extreme thermal conductivity and other desirable properties of diamond. This confers on the material numerous useful and novel properties. The articles of the present invention possess exceptional heat transfer capability and superior mechanical properties compared to consolidated particulate composites due to the use of a strong, contiguous framework for diamond deposition. The articles of the present invention are easier to fabricate compared to microchannel structures. The articles of the present invention have excellent corrosion resistance due to diamond's superior chemical properties. The articles of the present invention possess superior economic utility through use of inexpensive framework materials. The articles of the present invention have electrical properties that can be adjusted by doping the diamond coating to alter its electrical characteristics.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An article comprising:

a non-metallic reticulated unitary structure;

an interlayer coated on said non-metallic reticulated unitary structure;

a diamond layer deposited on said interlayer configured to form a contiguous open structure configured for fluid flow in more than one axis through said contiguous open structure, wherein said diamond is fully coalesced.

2. An article comprising diamond directly deposited on a non-metallic open-cell foam substrate having a porosity sufficient to permit the flow of fluids in at least one direction through the non-metallic open cell foam substrate, wherein said diamond is fully coalesced.

* * * * *